April 14, 1959

G. H. DE WITZ 2,882,403

USE OF ELECTRICALLY CONTROLLABLE VARIABLE INDUCTOR FOR TUNING PURPOSES

Filed Oct. 25, 1956

INVENTOR,
GERHARD H. DEWITZ.

BY Harry M. Saragovitz
ATTORNEY

United States Patent Office 2,882,403

Patented Apr. 14, 1959

2,882,403

USE OF ELECTRICALLY CONTROLLABLE VARIABLE INDUCTOR FOR TUNING PURPOSES

Gerhard H. De Witz, Glendale, Calif., assignor to the United States of America as represented by the Secretary of the Army Application October 25, 1956, Serial No. 618,411

3 Claims. (Cl. 250—36)

This invention relates to electrically-controllable variable inductors, and particularly to the use of such inductors for controlling the tuning of electrical circuits, such as resonant circuits, selective networks, oscillators, communication receivers and the like. This application is supplemented by a divisional application, Serial Number 738,908, filed May 20, 1958.

One of the difficulties experienced in the practical application of the usual inductor of this type is that its obtainable "Q," i.e., ratio of inductive reactance to resistance, is limited at high frequencies, whereas many electrical circuits in which such inductors might be used for tuning purposes, such as oscillators and communication receivers, require a relatively high value of "Q" for operation at such high frequencies. For example, to obtain a high degree of selectivity in a high frequency communication receiver, it is desirable to use high "Q" tuned circuits therein. Of course it is possible to obtain the same degree of selectivity by the use of capacitively tuned circuits or a greater number of cascaded, inductively-tuned stages of lower "Q" values, but these alternatives are relatively uneconomical.

A general object of the invention is to improve electrically-controllable variable inductors so as to make them suitable for tuning electrical apparatus requiring relatively high values of "Q" for proper operation at certain frequencies.

A related object is to improve electrically-controllable variable inductors so as to make them suitable for controlling simultaneously the tuning of two or more coupled resonant circuits.

Another object is to provide a high degree of selectivity in an electrical circuit with a small number of inductively-tuned tuning stages.

Another object is to control inductively the tuning of and the coupling between electrical resonant circuits.

A more specific object is to control inductively the frequency of oscillation of an oscillator, for example, an oscillator of the Wien-bridge type, efficiently and economically.

The circuits in accordance with the invention for accomplishing these objects utilize an electrically-controllable variable inductor which is a modification of one disclosed in the U.S. patent to L. M. Carver, No. 2,708,219, issued May 10, 1955. This modified inductor consists of a magnetic core in the form of a toroid or ring with a single control winding and a plurality of controlled windings wound on this core. The magnetic core is formed from a ferromagnetic material suitable for high frequencies and of high permeability, and includes a slot or window through the sides of the core at two or more spaced points around its periphery. Each of the controlled windings extends through a different one of the slots and is wound around the core portions on each side of that slot in such manner that any magnetic fields established in the core in response to current flowing through the winding will close around the respective slot, with the result that electromagnetic couplings between the controlled windings and between each of these windings and the control winding will be negligible. The inductances of the controlled windings vary in accordance with the amount of saturation produced in the magnetic core by the control winding which in turn is dependent on the amplitude of the control or saturating D.-C. current applied to the latter winding.

In accordance with one modification of the invention, the controlled windings of the above-described variable inductor are associated with each other and with auxiliary fixed value capacitors or such capacitors and one or more fixed value inductors to form coupled resonant circuits, the tuning of which is simultaneously controlled inductively by controlling the amplitude of D.-C. current applied to the control winding. In one type of circuit so formed, the connections are such that the coupling between the resonant circuits is constant and independent of frequency. In another type of circuit so formed, the connections are such that the couplings between the resonant circuits vary with frequency.

A feature of the invention is the use of the above-described variable inductor to tune an oscillator of the Wien-bridge type to the desired oscillation frequency by balancing the Wien-bridge located in an oscillator negative feedback path, at that frequency so as to reduce the negative feedback to zero.

The various features and objects of the invention will be better understood from the following detailed description thereof when it is read in conjunction with the various figures of the drawing in which.

Figure 1:
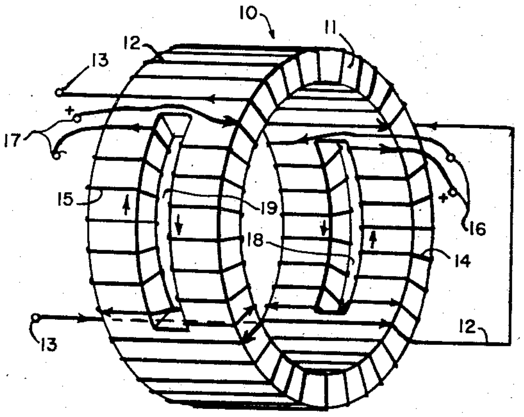
Fig. 1 shows a perspective view of one embodiment of the electrically-controllable variable inductor used in the circuits of the invention.
Figure 4:
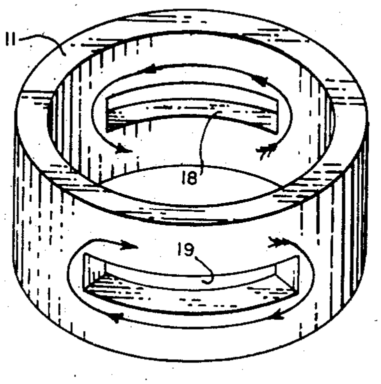
Figure 5:
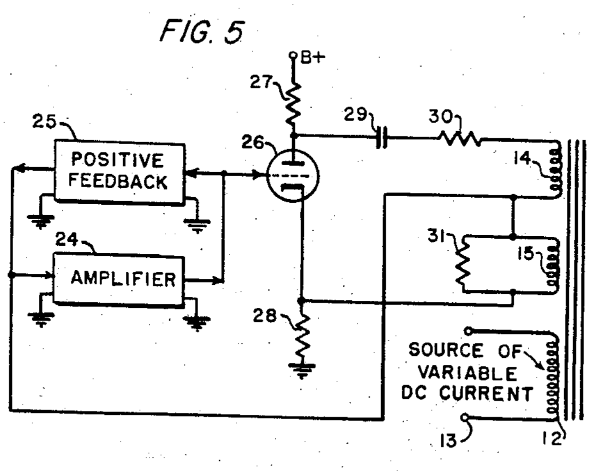

Fig. 4 shows diagrammatically the location and direction of the magnetic fields established in the magnetic core of the variable inductor of Fig. 1 by current flowing in the controlled windings, for a preferred arrangement and relative poling of these windings; and Fig. 5 shows schematically the application of the variable inductor of Fig. 1 to control the oscillation frequency of an oscillator of the Wien-bridge type, in accordance with the invention.

As shown in Fig. 1, the variable inductor 10 used for tuning purposes in the circuits of the invention includes a magnetic core 11 in the form of a toroid or ring; and a single control winding 12 having terminals 13, and two controlled signal windings 14 and 15, having terminals 16 and 17, respectively, wound on the core 11. The magnetic core 11 may consist of any suitable magnetic material having a high permeability, for example a ferromagnetic material or a ferromagnetic ceramic material commonly referred to as "ferrite" and described in the U.S. Patents 2,452,529; 2,452,530 and 2,452,531 to Snoeck, in finely divided or laminated form.

The core 11 has two rectangular windows 18, 19 formed in its opposite sides. Although it is usually preferable for reasons of symmetry and balance that these slots in the core be located at diametrically opposite points, other relative locations may prove more suitable for particular applications of the variable inductor.

Each of the controlled signal windings 14 and 15 has two equal series-connected sections. The winding 14 extends through the core slot 18 with one of its sections wound around the adjacent portion of the core on one side of that slot, and the other of its sections wound around the adjacent core portion on the opposite side of that slot. Similarly, the winding 15 extends through the other core slot 19 with one of its sections wound around the adjacent core portion on one side of that slot and the other of its sections wound around the adjacent core portion on the opposite side of that slot.

The winding arrangements of the controlled signal windings 14 and 15 above described are such that the flux lines of the magnetic fields established in the core 11 due to current flowing in these windings will form closed loops around the respective slots 18 and 19. Thus, the electromagnetic mutual couplings between the two signal windings 18 and 19 and between each of these windings and the control winding 12 will be negligible. This decoupling effect may be increased by relatively poling the two signal windings 14 and 15 so that the fluxes due to the currents flowing in their windings pass around the slots 18 and 19 in the core 11 in reversed senses, as indicated by the arrows in Fig. 4. Due to the extreme shortness of the flux paths around the slots 18 and 19 in the core, relatively high "Q" values can be obtained with this variable inductor making it particularly suitable for use in electrical circuits requiring high "Q" values for proper operation at high frequencies.

The inductances of the two controlled signal windings 14 and 15, and thus their inductive effects in any electrical circuit in which they may be connected through their terminals 16 and 17, respectively, may be varied by varying the amount of saturation in the core. This is done by varying the amplitude of saturating D.-C. current supplied to the control winding 12 from a suitable source connected across the terminals of that winding. In order to obtain the maximum inductive effect for a given amount of applied D.-C. control current, the control winding 12 preferably is wound so that it surrounds substantially all of the core 11 except for the regions thereof occupied by the slots 18 and 19 and the signal windings 14 and 15. For reasons of clarity the control winding 12 is shown in Fig. 1 as having only relatively few turns, but in practice it would usually have a large number of turns.

Figure 2:
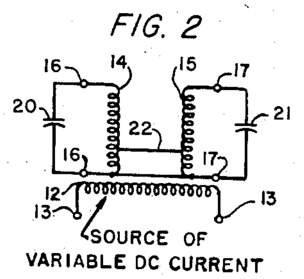
Figs. 2 and 3 show schematically two of the many possible connections in accordance with the invention of the windings of the variable inductor of Fig. 1 to auxiliary capacitors or such capacitors and fixed value inductors to provide electrically-controllable, inductively-tunable coupled resonant circuits.

Fig. 2 shows one of the many electrical circuit arrangements in which a variable inductor such as shown in Fig. 1 could be used for tuning and coupling purposes. In this arrangement a capacitor 20 is connected across the terminals 16 of the controlled winding 14 to form therewith one resonant circuit, a second capacitor 21 is connected across the terminals 17 of the winding 15 to form therewith a second resonant circuit, and the two resonant circuits are coupled by a direct connection 22 between corresponding points on the two windings 14 and 15, as shown. The inductances of the windings 14 and 15 in the respective resonant circuits are simultaneously adjusted in equal amounts to the values required to tune the resonant circuits to the desired frequencies by the application of D.-C. control current of proper value to the control winding 12 to provide the necessary amount of saturation in the magnetic core on which the windings 12, 14 and 15 are wound in the manner previously described in connection with Fig. 1. Because of the direct electrical connection 22 between corresponding points on the two controlled windings in the two resonant circuits, the coupling between these circuits will be constant regardless of the frequency to which they are tuned.

Although not so shown in Fig. 2 of the drawings, the connection 22 between the controlled windings 14 and 15 in some applications alternatively might include circuit elements such as capacitors or resistors of suitable values, thereby achieving a coupling of any desired relationship to frequency. As the Q of the circuit arrangement may increase or decrease with the amount of saturation of the core, it is usually desirable to obtain constant bandwidth. Constant bandwidth between double tuned circuits is obtained by keeping the factor KQ constant, wherein K represents the amount of coupling; therefore, as Q varies, K should vary inversely. Additional circuit elements in the coupling connection 22 for this purpose, therefore, may be desirable.

Figure 3:
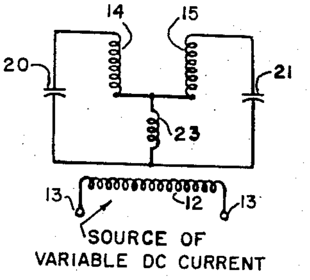

The circuit arrangement of Fig. 3 differs from that of Fig. 2 essentially in the inclusion of an inductor 23 of fixed value in series with the capacitor in each resonant circuit, and common to both resonant circuits so as to provide a coupling between these circuits which varies the frequency.

Fig. 5 shows how a variable inductor such as shown in Fig. 1 may be utilized for controlling the frequency of oscillation of an oscillator of a modified Wien-bridge type. As shown, the oscillation portion proper of this oscillator comprises an amplifier represented by the box 24, and a positive feedback circuit connecting its output to its input, represented by the box 25. This amplifier-positive feedback combination 24, 25 by itself will oscillate at some frequency determined by the characteristics of its component circuit elements. The output of the amplifier 24 is connected directly to the control grid-cathode circuit of a three-electrode vacuum tube 26, operating as an amplifier and inverter, the anode-cathode circuit of this tube including a suitable load resistor 27, a D.-C. voltage source for positively biasing the anode with respect to the cathode, and a resistor 28 connected between its cathode and ground. The anode of the tube 26 is connected through a capacitor 29 and a modified Wien-bridge including the controlled windings 14 and 15 of a variable inductor such as shown in Fig. 1, in series to the cathode of that tube. In the particular modified Wien-bridge shown, the winding 14 and resistor 30 in series therewith are included in one bridge arm and the winding 15 and the resistor 31 in shunt therewith in another bridge arm. The bridge output is connected to the input of the amplifier 24 in such manner as to provide a negative feedback connection thereto. The negative feedback provided by the connections described from one output of the amplifier 24 to its input will exist at all frequencies except the balance frequency of the bridge (that of zero output from the bridge), and by suitable selection of circuit constants for the negative feedback connection, the amount of negative feedback may be made sufficient to overcome the positive feedback provided by connection 25 and prevent oscillation of the amplifier 24 except at this balance frequency.

The control or saturating winding 12 of the variable inductor of Fig. 1 and the associated adjustable amplitude D.-C. current supply circuit are utilized in the oscillator of Fig. 5 to vary the saturation of the magnetic core 11 (shown diagrammatically) of the variable inductor and thus to vary simultaneously in equal amounts the inductance values of the two controlled signal windings 14 and 15 of the inductor in the manner previously described in connection with Fig. 1 to maintain the bridge balanced at a frequency determined by the adjusted inductance values of these windings. By suitable selection of the amplitude of the D.-C. control current supplied to the control winding 12, the adjusted inductance value of the controlled windings 14 and 15 in the Wien-bridge may be made such that the bridge is balanced at the desired frequency of oscillation of the oscillator. When the bridge is balanced for this frequency, there will be zero output from the bridge and no negative feedback voltages will be applied to the input of the amplifier-positive feedback combination 24, 25. This combination, therefore, is constrained to oscillate at this frequency. This frequency is determined by the inductances of the controlled windings of the electrically controllable variable inductor since, in this configuration, the frequency of oscillation is inversely proportional to the inductance rather than to the square root of the inductance.

As is well known, the bridge circuit of an oscillator of the Wien-bridge type allows a voltage of only one frequency to be effective in the circuit because of the degeneration and place shift provided by the circuit. In the oscillator circuit of Fig. 5, oscillation can only take place at the frequency $f_0$ which permits the voltage across resistor 31 (in shunt with winding 15), which is the input signal to the amplifier 24, to be in phase with the output voltage of the amplifying tube 26, and for which the positive feedback voltage (that provided by circuit 25) exceeds the negative feedback voltage. A voltage of any other frequency will cause a phase shift between the output of amplifier 26 and the input to amplifier 24, or will be attenuated by the high degeneration of the circuit, so that the feedback voltage is not adequate to maintain oscillation at a frequency other than $f_0$.

Although the electrically controllable variable inductor in the circuits of the invention as shown in Figs. 1 and 4 and described above has only one pair of slots in the magnetic core, it is to be understood that in circuits utilizing larger toroids or rings for the core, three slots 120 angular degrees apart or four 90 degrees apart may be used. Where more than two slots are used, there may be a small amount of undesired coupling. This may be easily minimized by any suitable means for preventing coupling back from a high to a low level stage, and by orienting the slots to reduce the flux linkages between windings to a minimum. Other changes in the variable inductor structures or the circuits in which they are used which are within the spirit and scope of the invention will occur to persons skilled in the art.

What is claimed is:

1. In combination, an oscillator of the Wien-bridge type including an amplifier having an input and an output circuit, a positive feedback connection between said output and input circuits of said amplifier, the amplifier-positive feedback combination, by itself, being adapted to oscillate at a frequency determined by the characteristics of its component circuit elements, an electron discharge device having a control grid-cathode circuit connected to said output circuit of said amplifier, and an anode-cathode circuit, a negative feedback connection including a capacitor and a frequency-selective Wien-bridge in series between the anode-cathode circuit of said electron discharge device and the input circuit of said amplifier, the circuit constants of said negative feedback connection being selected such that sufficient negative feedback is applied to said amplifier at all frequencies except the balance frequency of said Wien-bridge to prevent oscillation of said amplifier-positive feedback combination, a variable inductor control means in said Wien-bridge including a source of D.-C. control current adjustable in amplitude, a saturable magnetic core, a control winding on said core connected to said source, for saturating said core in an amount dependent on the adjusted amplitude of the control current applied to that winding from said source, and a pair of equal controlled signal windings wound on said core, variable in inductance in accordance with the saturation of said core, said controlled windings being respectively included in different arms of said bridge so that they maintain the bridge balanced for a different frequency for each adjusted value of their inductances and prevent negative feedback to said amplifier at the balance frequency, the values of the circuit elements of said bridge being selected such that when the inductances of the pair of controlled windings are adjusted to particular values in response to the application of control current of a particular value to said control winding, the bridge is selectively balanced so as to prevent negative feedback at the desired frequency of oscillation of the oscillator and the said amplifier-positive feedback combination is constrained to oscillate at this frequency.

2. The combination of claim 1, in which said core has two slots in its respective opposite sides, each of said controlled windings has two equal series-connected sections, each controlled winding extending through a different one of said slots with one section wound around the adjacent core portion on one side of that slot and the other section wound around the adjacent core portion on the opposite side of that slot in such manner that the flux of any magnetic fields established in the core due to current flow in that winding closes around the respective slot and said control winding being wound as a different portion of said core than said controlled windings, which does not include said slots so that the electromagnetic mutual coupling between the two controlled windings and between each of these windings and said control winding will be negligible and the obtainable ratio of inductive reactance to resistance of said variable inductor will be high due to the extremely short lengths of the magnetic flux paths produced in said core.

3. The combination of claim 1, in which one arm of said bridge includes one of said controlled windings shunted by a resistor, and another arm of the bridge includes the other of said controlled windings and a resistor in series.

References Cited in the file of this patent

UNITED STATES PATENTS

| | | |
|---|---|---|
| 1,328,797 | Alexanderson | Jan. 20, 1920 |
| 2,708,219 | Carver | May 10, 1955 |
| 2,811,639 | Sontheimer | Oct. 29, 1957 |
| 2,820,109 | De Witz | Jan. 14, 1958 |

FOREIGN PATENTS

| | | |
|---|---|---|
| 705,565 | Germany | Mar. 27, 1941 |